(12) United States Patent
Gong et al.

(10) Patent No.: US 11,790,243 B1
(45) Date of Patent: Oct. 17, 2023

(54) FERROELECTRIC FIELD EFFECT TRANSISTOR FOR IMPLEMENTATION OF DECISION TREE

(71) Applicant: International Business Machines Corporation, Armonk, NY (US)

(72) Inventors: Nanbo Gong, White Plains, NY (US); Takashi Ando, Eastchester, NY (US); Guy M. Cohen, Westchester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/809,951

(22) Filed: Jun. 30, 2022

(51) Int. Cl.
G06N 5/01 (2023.01)
G11C 11/54 (2006.01)
G11C 11/22 (2006.01)
H10B 51/30 (2023.01)

(52) U.S. Cl.
CPC .............. *G06N 5/01* (2023.01); *G11C 11/223* (2013.01); *G11C 11/2273* (2013.01); *G11C 11/2297* (2013.01); *G11C 11/54* (2013.01); *H10B 51/30* (2023.02)

(58) Field of Classification Search
CPC ..... G06N 5/01; G11C 11/223; G11C 11/2273; G11C 11/2297; G11C 11/54; H10B 51/30
USPC ........................................................ 365/145
See application file for complete search history.

(56) References Cited

U.S. PATENT DOCUMENTS

| 7,193,437 | B2* | 3/2007 | Cappelli ............ H03K 19/1776 365/189.11 |
| 7,965,536 | B2 | 6/2011 | Hashimoto et al. |
| 10,217,522 | B2 | 2/2019 | Wang et al. |
| 10,269,406 | B2 | 4/2019 | Bayram et al. |
| 10,424,379 | B2 | 9/2019 | Slesazeck et al. |
| 10,699,783 | B1 | 6/2020 | Raad et al. |
| 11,145,676 | B1 | 10/2021 | Chiang et al. |
| 11,615,827 | B2* | 3/2023 | Graves ................ G11C 11/4125 365/148 |
| 2014/0347096 | A1* | 11/2014 | Afshar ............... H03K 19/1737 326/41 |
| 2017/0352802 | A1 | 12/2017 | Nikonov et al. |
| 2022/0121430 | A1* | 4/2022 | Venkat .................... G06F 8/441 |
| 2022/0351776 | A1* | 11/2022 | Nam ..................... G11C 11/223 |

FOREIGN PATENT DOCUMENTS

CN 114613404 A * 6/2022 ........... G06F 7/5443

OTHER PUBLICATIONS

"Decision Tree" Wikipedia, [online]; [retrieved on Jun. 14, 2022]; retrieved from the Internethttps://en.wikipedia.org/w/index.php?title=Decision_tree&oldid=1091816212.

(Continued)

*Primary Examiner* — Fernando Hidalgo
(74) *Attorney, Agent, or Firm* — CANTOR COLBURN LLP; Erik Johnson

(57) ABSTRACT

A unit structure of non-volatile memory is provided. The unit structure includes a substrate, an n-type ferroelectric field effect transistor (FeFET) and a p-type FeFET disposed on the substrate, first circuitry by which sources of the n-type FeFET and the p-type FeFET are electrically coupled in parallel downstream from a common terminal and second circuitry by which top electrodes of the n-type FeFET and the p-type FeFET are electrically coupled in parallel upstream of a common terminal.

15 Claims, 3 Drawing Sheets

(56) References Cited

OTHER PUBLICATIONS

Berdan, "In-memory Reinforcement Learning with Moderately-Stochastic Conductance Switching of Ferroelectric Tunnel Junctions", 2019 Symposium on VLSI Technology Digest of Technical Papers, 2 p.

Gong, "A Study of Endurance Issues in HfO2-based Ferroelectric Field Effect Transistors: Charge Trapping and Trap Generation", IEEE, 2017, 4p.

Safavian, "A Survey of Decision Tree Classifier Methodology", Purdue University, Sep. 1990, 50 p.

* cited by examiner

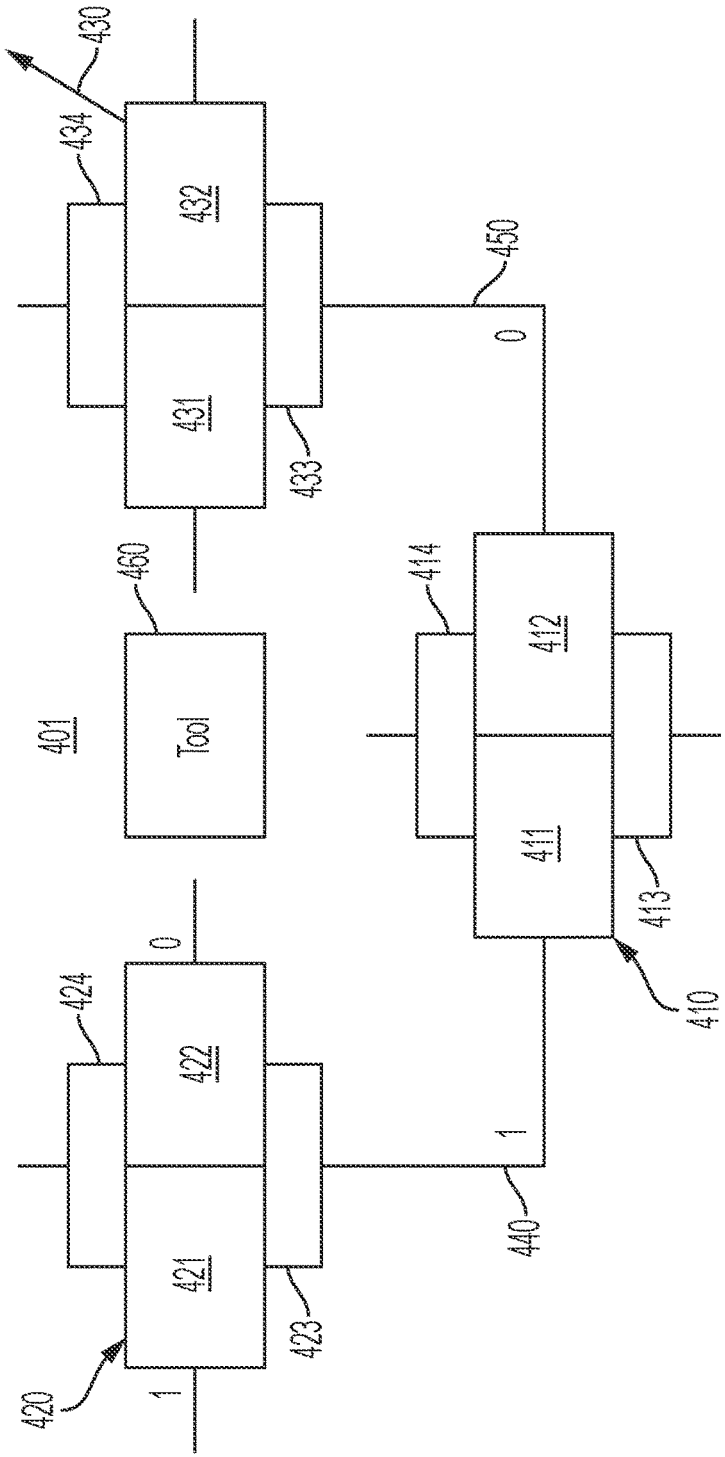
FIG. 4
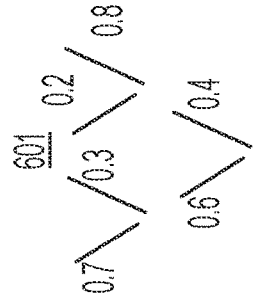
FIG. 6
FIG. 5

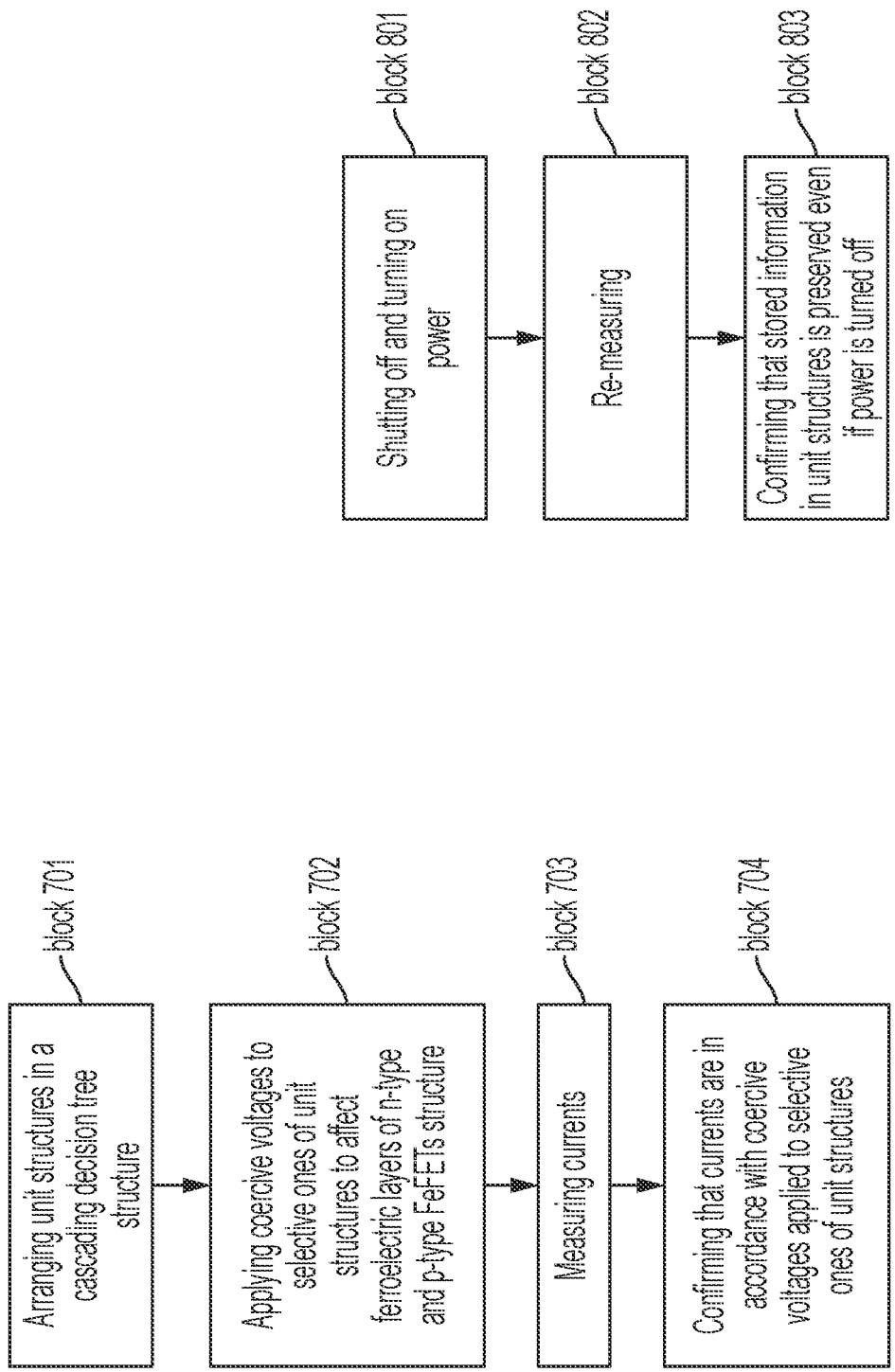

FERROELECTRIC FIELD EFFECT TRANSISTOR FOR IMPLEMENTATION OF DECISION TREE

BACKGROUND

The present invention generally relates to ferroelectric devices. More specifically, the present invention relates to ferroelectric field effect transistors (FeFETs) for implementation of a decision tree.

An FeFET is a type of field-effect transistor that includes a ferroelectric material sandwiched between the gate electrode and source-drain conduction region of the device (the channel). Permanent electrical field polarization in the ferroelectric causes this type of device to retain the transistor's state (on or off) in the absence of any electrical bias. Devices based on FeFETs are used in FeFET memory, a type of single transistor non-volatile memory.

SUMMARY

Embodiments of the present invention are directed to a unit structure of non-volatile memory. A non-limiting example of the unit structure includes a substrate, an n-type ferroelectric field effect transistor (FeFET) and a p-type FeFET disposed on the substrate, first circuitry by which sources of the n-type FeFET and the p-type FeFET are electrically coupled in parallel downstream from a common terminal and second circuitry by which top electrodes of the n-type FeFET and the p-type FeFET are electrically coupled in parallel upstream of a common terminal.

Embodiments of the present invention are directed to a cascading decision tree structure of non-volatile memory. A non-limiting example of the cascading decision tree structure includes first, second, and third unit structures. Each of the first, second, and third unit structures includes n-type and p-type ferroelectric field effect transistors (FeFET), first circuitry by which sources of the n-type and p-type FeFETs are electrically coupled and second circuitry by which top electrodes of the n-type and p-type FeFETs are electrically coupled. The cascading decision tree structure further includes additional circuitry by which drains of the n-type and p-type FeFETs of the first unit structure are electrically coupled to sources of the n-type and p-type FeFETs of the second and third unit structures.

Embodiments of the invention are directed to a method of operating non-volatile memory. A non-limiting example of the method includes arranging unit structures in a cascading decision tree structure, each of the unit structures including n-type and p-type ferroelectric field effect transistors (FeFET), applying coercive voltages to selective ones of the unit structures to affect respective polarities of ferroelectric layers of the n-type and p-type FeFETs thereof, measuring currents across the n-type and p-type FeFETs of the selective ones of the unit structures and confirming that stored information in the unit structures is preserved even if power is turned off.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4 is a schematic diagram of a cascading decision tree structure including multiple unit structures in accordance with one or more embodiments of the invention;

FIG. 5 is an exemplary readout of the cascading decision tree structure of FIG. 4 in accordance with one or more embodiments of the invention;

FIG. 6 is an exemplary weighted readout of the cascading decision tree structure of FIG. 4 in accordance with one or more embodiments of the invention;

FIG. 7 is a flow diagram illustrating a method of operating non-volatile memory in accordance with one or more embodiments of the present invention; and FIG. 8 is a flow diagram illustrating further operations of the method of operating non-volatile memory of FIG. 7 in accordance with one or more embodiments of the present invention.

Figure 1:
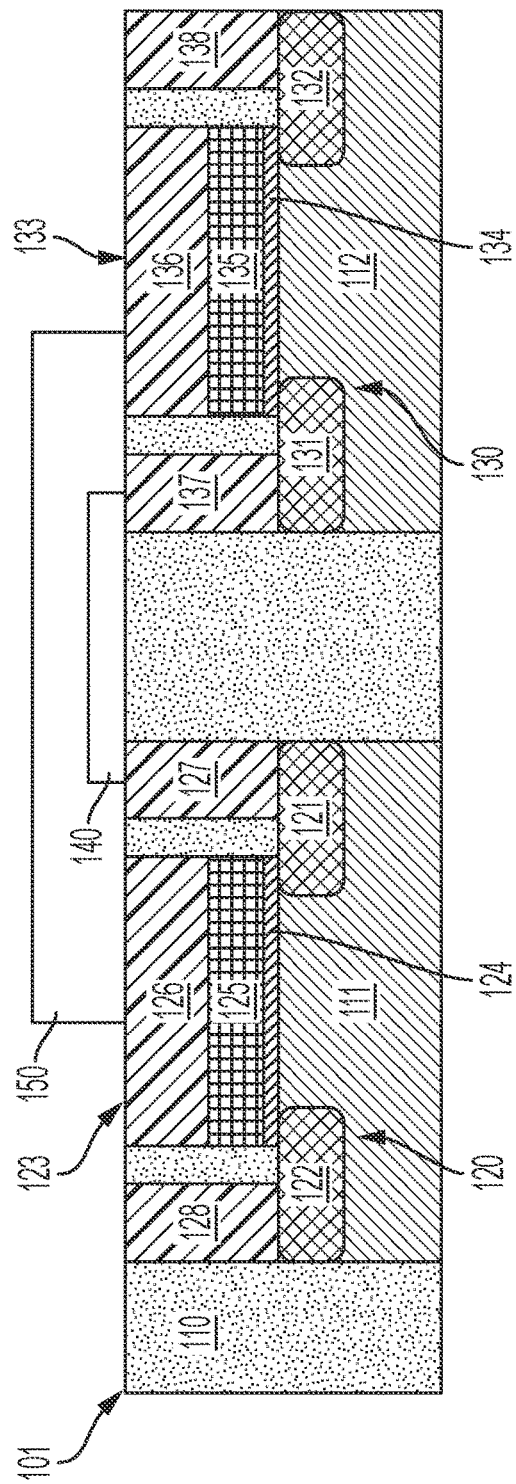
FIG. 1 depicts a side view of unit structure of non-volatile memory using ferroelectric field effect transistors (FeFETs) in accordance with one or more embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a FeFET is typically formed on a semiconductor substrate, such as a silicon substrate, and includes a source region, a drain region and a gate electrically interposed between the source region and the gate. The source region, the drain region and the gate each include terminal. The gate is provided as a stack between the source region and the drain region and includes an interfacial layer (IL), a ferroelectric layer and a metal layer. The IL is the lowermost layer and is in direct contact with an uppermost surface of the source region at a first end thereof and with an uppermost surface of the drain region at a second end thereof, which is opposite the first end. The ferroelectric layer is disposed on an uppermost surface of the IL and may be formed of at least one of a hafnium oxide (HfO2)-based ferroelectric oxide, a zirconium oxide (ZrO2)-based ferroelectric oxide, lead zirconate titanate (PZT)-based ferroelectric oxide, strontium bismuth tantalate (SBT)-based ferroelectric oxide or another suitable material. The metal layer is disposed on an uppermost surface of the ferroelectric layer and may be formed of at least one of titanium nitride (TiN), tungsten (W), platinum (Pt), platinum oxide (PtO), iridium (Ir), Iridium oxide (IrO), titanium aluminide (TiAl), tantalum aluminide (TaAl), titanium carbide (TiC), tantalum carbide (TaC), titanium aluminum carbide (TiAlC), tantalum aluminum carbide (TaAlC), aluminum carbide (AlC) or another suitable material.

An FeFET can be used in various applications, such as computing, to provide non-volatile memory and stored data that is maintained even when power to an overall system is turned off. Given the configuration of an FeFET as described above, the use of an FeFET for non-volatile memory can be enabled by the application of a coercive voltage to the gate terminal. As a result of this application of voltage, a polarity of the ferroelectric layer is set so that the gate either permits or prevents current from flowing from the source region to the drain region. Reading an FeFET is then conducted in a similar manner as reading a typical MOSFET. Current from source-to-drain is read while a fixed Vd is applied. Because of polarization switching changes Vt of the FeFET under the same Vg and Vd, one can tell the direction of polarization by detecting the on or off of channel current.

Meanwhile, in computing applications, decision tree structures are a popular tool in machine learning. A decision tree structure is one in which a first decision node leads to secondary decision nodes and each secondary decision node in turn leads to tertiary decision nodes, and so forth. That is, a decision tree is built by splitting a source set, including a root node of the decision tree, into subsets which form successor children. The splitting is based on a set of splitting rules based on classification features. This process is repeated on each derived subset in a recursive manner which is completed when the subset at a node has all the same values of a target variable, or when splitting no longer adds value to predictions.

In machine learning applications in particular, decision tree analysis is often helpful but requires a serial read of each node in a decision tree. This can be problematic because the time taken to serially read each node in a decision tree can be significant and can require processing resources that might otherwise be better spent elsewhere.

Turning now to an overview of the aspects of the invention, one or more embodiments of the invention address the above-described shortcomings of the prior art by providing cascaded FeFETs to store information in a non-volatile way, and to achieve one operation (O(1)) and a parallel readout of a decision tree. The unit structure includes one n-type FeFET and one p-type FeFET, to represent stored information. The FeFETs are cascaded, whereby a drain of one FeFET connects to a source of a next FeFET. The resulting cascaded structure enables a readout of serial computations with one operation in a parallel manner.

The above-described aspects of the invention address the shortcomings of the prior art by providing non-volatile memory structures in the form of cascaded FeFETs that make up a decision tree whose serial computations can be read with one operation in a parallel manner.

Turning now to a more detailed description of aspects of the present invention, FIG. 1 depicts a schematic diagram of a unit structure 101 of a decision tree for non-volatile memory according to embodiments of the invention. As shown in FIG. 1, the unit structure 101 includes a substrate 100 formed of semiconductor material such as, but not limited to silicon (Si) and including a n-doped region 111 and a p-doped region 112, a first FeFET 120 disposed on the n-doped region 111 and a second FeFET 130 disposed on the p-doped region 112. The unit structure 101 can further include first circuitry 140 and second circuitry 150.

The first FeFET 120 can be provided as an n-type FeFET and includes a source 121, a drain 122 and a gate 123 electrically interposed between the source 121 and the drain 122. The gate 123 includes an IL 124 electrically connected to uppermost surfaces of the source 121 and the drain 122, a ferroelectric oxide layer 125 disposed on an uppermost surface of the IL 124 and a top electrode 126 disposed on an uppermost surface of the ferroelectric oxide layer 125. The ferroelectric oxide layer 125 can include or be formed of any ferroelectric oxide and can include at least one of a hafnium oxide (HfO2)-based ferroelectric oxide, a zirconium oxide (ZrO2)-based ferroelectric oxide, a lead zirconate titanate (PZT)-based ferroelectric oxide, a strontium bismuth tantalate (SBT)-based ferroelectric oxide or another suitable oxide. The top electrode 126 can include various conductive materials such as, but not limited to, at least one of titanium nitride (TiN), tungsten (W), platinum (Pt), platinum oxide (PtO), iridium (Ir), Iridium oxide (IrO), titanium aluminide (TiAl), tantalum aluminide (TaAl), titanium carbide (TiC), tantalum carbide (TaC), titanium aluminum carbide (TiAlC), tantalum aluminum carbide (TaAlC), aluminum carbide (AlC) or another suitable material. The first FeFET 120 can further include a first contact 127, which is electrically coupled to the source 121 and a second contact 128, which is electrically coupled to the drain 122.

The second FeFET 130 can be provided as a p-type FeFET and includes a source 131, a drain 132 and a gate 133 electrically interposed between the source 131 and the drain 132. The gate 133 includes an IL 134 electrically connected to uppermost surfaces of the source 131 and the drain 132, a ferroelectric oxide layer 135 disposed on an uppermost surface of the IL 134 and a top electrode 136 disposed on an uppermost surface of the ferroelectric oxide layer 135. The ferroelectric oxide layer 135 can include or be formed of any ferroelectric oxide and can include at least one of a hafnium oxide (HfO2)-based ferroelectric oxide, a zirconium oxide (ZrO2)-based ferroelectric oxide, a lead zirconate titanate (PZT)-based ferroelectric oxide, a strontium bismuth tantalate (SBT)-based ferroelectric oxide or another suitable oxide. The top electrode 136 can include various conductive materials such as, but not limited to, at least one of titanium nitride (TiN), tungsten (W), platinum (Pt), platinum oxide (PtO), iridium (Ir), Iridium oxide (IrO), titanium aluminide (TiAl), tantalum aluminide (TaAl), titanium carbide (TiC), tantalum carbide (TaC), titanium aluminum carbide (TiAlC), tantalum aluminum carbide (TaAlC), aluminum carbide (AlC) or another suitable material. The second FeFET 130 can further include a first contact 137, which is electrically coupled to the source 131 and a second contact 138, which is electrically coupled to the drain 132.

Figure 2:
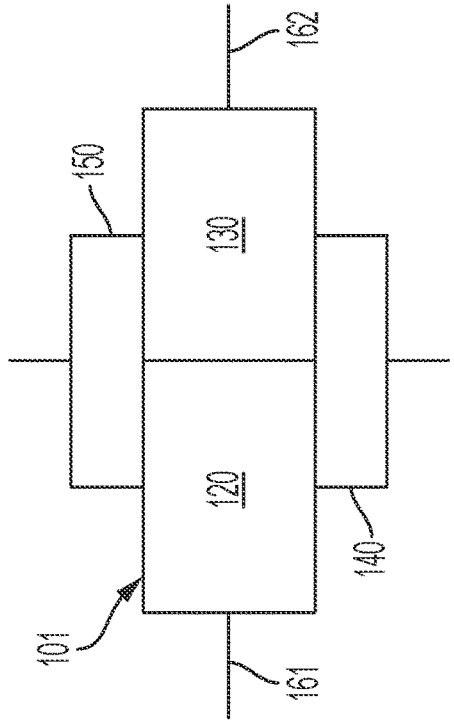
FIG. 2 depicts a schematic diagram of the unit structure of FIG. 1 in accordance with one or more embodiments of the invention.

With continued reference to FIG. 1 and with additional reference to FIG. 2, the first circuitry 140 includes a common terminal and wiring that splits off the common terminal to electrically couple the source 121 of the first FeFET 120 with the source 131 of the second FeFET 130. As such, that the source 121 of the first FeFET 120 and the source 131 of the second FeFET 130 are effectively disposed in parallel with one another downstream from the common terminal of the first circuitry 140 (see FIG. 2). The second circuitry 150 includes wiring that combines into a common terminal to electrically couple the top electrode 126 of the first FeFET 120 with the top electrode 136 of the second FeFET 130. As such, the top electrode 126 of the first FeFET 120 and the top electrode 136 of the second FeFET 130 are effectively disposed in parallel with one another upstream of the common terminal of the second circuitry 150 (see FIG. 2). Additional circuitry including first additional circuitry 161 and second additional circuitry 162 can be electrically coupled to the drains 122 and 132 of the first and second FeFETs 120 and 130, respectively. This additional circuitry will be described in greater detail below with reference to the formation of a cascading decision tree structure for use in non-volatile memory.

Figure 3:
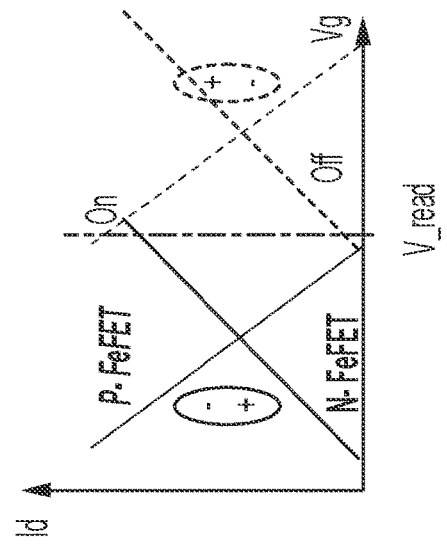
FIG. 3 is a graphical display of a readout of the unit structure of FIG. 1 in accordance with one or more embodiments of the invention.

With reference to FIGS. 2 and 3, with the construction described above, the ferroelectric oxide layer 125 of the first FeFET 120 and the ferroelectric oxide layer 135 of the second FeFET 130 will, at least at an initial time, have a same polarization for both the n-type and the p-type FeFET. As such, one of the first FeFET 120 and the second FeFET 130 will be on and the other one will be off. That is, the first FeFET 120 and the second FeFET 130 are provided in a 1-on and 1-off state. The first FeFET 120 and the second FeFET 130 will therefore act together as a switch based on polarization of ferroelectric oxide in each. Thus, the unit structure 101 overall will act as a switch.

That is, due to the polarization of the ferroelectric oxide layers 125 and 135 of the first and second FeFETs 120 and 130, the first FeFET 120 may be set to the "on" condition and the second FeFET 130 may be set to the "off" condition. In this case, the first FeFET 120 permits current to flow from the source 121 to the drain 122 with little to no resistivity and, conversely, the second FeFET 130 is highly resistive and little to no current is permitted to pass from the source 131 to the drain 132. Therefore, as least initially, when current is applied to the sources 121 and 131 of the first and second FeFETs 120 and 130, respectively, by way of the first circuitry 140, the first FeFET 120 will be able to be read as being "on" as expressed by the "1" at the drain 122 of the first FeFET 120 and the second FeFET 130 will be able to be read as being "off" as expressed by the "0" at the drain 132 of the second FeFET 130. As noted above, the reading of the first and second FeFETs 120 and 130 can be conducted in a similar manner as the reading of a typical MOSFET. Current from source-to-drain is read while a fixed Vd is applied. Because of polarization switching changes Vt of the FeFET under the same Vg and Vd, one can tell the direction of polarization by detecting the on or off of channel current. The reading of the "on" or "off" conditions can be conducted by way of the second circuitry 150. This condition will persist over any number of "power on-off" cycles.

At a subsequent time, a coercive voltage can be selectively applied to the top electrode 126 of the first FeFET 120 and to the top electrode 136 of the second FeFET 130 by way of the second circuitry 150. This coercive voltage has the effect of switching the polarities of the ferroelectric oxide layer 125 of the first FeFET 120 and the ferroelectric oxide layer 135 of the second FeFET 130. As a result, the second FeFET 130 permits current to flow from the source 131 to the drain 132 with little to no resistivity and, conversely, the first FeFET 120 is highly resistive and little to no current is permitted to pass from the source 121 to the drain 122. In this case, the "on" and "off" conditions can be read similarly as described above by way of the second circuitry 150. This condition will persist over any number of "power on-off" cycles.

In accordance with the embodiments, the application of the coercive voltage can be controlled to limit a degree of a polarity change-over. In these or other cases, the resulting reads of the "on" or "off" conditions of the first and second FeFETs 120 and 130 will be weighted. That is, when current is applied to the sources 121 and 131 of the first and second FeFETs 120 and 130, respectively, by way of the first circuitry 140, the second FeFET 130 will be able to be read as being "on-partially" as expressed by a "0.8" (for example) at the drain 132 of the second FeFET 130 and the first FeFET 120 will be able to be read as being "off-partially" as expressed by the "0.2" at the drain 122 of the first FeFET 120. The reading of the "on-partially" or "off-partially" conditions can be conducted by measuring currents across the first and second FeFETs 120 and 130 by way of the second circuitry 150. This condition will persist over any number of "power on-off" cycles.

With reference to FIG. 4, a cascading decision tree structure 401 of non-volatile memory is provided. The cascading decision tree structure 401 includes a first unit structure 410, a second unit structure 420 and a third unit structure 430. Each of the first, second, and third unit structures 410, 420 and 430 are generally constructed as described above with reference to the unit structure 101 of FIGS. 1 and 2 and a detailed description thereof is not needed except as follows. The first unit structure 410 includes an n-type FeFET 411 and a p-type FeFET 412, first circuitry 413 by which sources of the n-type and p-type FeFETs 411 and 412 are electrically coupled and second circuitry 414 by which top electrodes of the n-type and p-type FeFETs 411 and 412 are electrically coupled. The second unit structure 420 includes an n-type FeFET 421 and a p-type FeFET 422, first circuitry 423 by which sources of the n-type and p-type FeFETs 421 and 422 are electrically coupled and second circuitry 424 by which top electrodes of the n-type and p-type FeFETs 421 and 422 are electrically coupled. The third unit structure 430 includes an n-type FeFET 431 and a p-type FeFET 432, first circuitry 433 by which sources of the n-type and p-type FeFETs 431 and 432 are electrically coupled and second circuitry 434 by which top electrodes of the n-type and p-type FeFETs 431 and 432 are electrically coupled.

The cascading decision tree structure 401 further includes additional circuitry by which drains of the n-type and p-type FeFETs 411 and 412 of the first unit structure 410 are electrically coupled to sources of the n-type and p-type FeFETs 421 and 422 of the second unit structure 420 and to sources of the n-type and p-type FeFETs 431 and 432 of the third unit structure 430. The additional circuitry can include first additional circuitry 440 to electrically couple the drain of the n-type FeFET 411 of the first unit structure 410 to sources of the n-type and p-type FeFETs 421 and 422 of the second unit structure 420 and second additional circuitry 450 to electrically couple the drain of the p-type FeFET 412 of the first unit structure 410 to sources of the n-type and p-type FeFETs 431 and 432 of the third unit structure 430.

Thus, it can be seen that the second and third unit structures 420 and 430 are disposed in parallel with one another downstream from the first unit structure 410. As such, it is to be understood that first additional unit structures (not shown) can be disposed in parallel with one another downstream from the second unit structure 420 and that second additional unit structures (not shown) can be disposed in parallel with one another downstream from the third unit structure 430 without deviating from the general description of the construction of the cascading decision tree structure 401 of FIG. 4.

As shown in FIG. 4, the n-type FeFET 411 of the first unit structure 410 is "on," the p-type FeFET 412 of the first unit structure 410 is "off" and the same is true for the second unit structure 420. This state can be prior to the coercive voltage being selectively applied or subsequent to the coercive voltage being selectively applied. In any case, with an application of voltage to the sources of the n-type FeFET 411 and the p-type FeFET 412 of the first unit structure 410, the currents across the first and second unit structures 410 and 420 can be measured to obtain a non-weighted readout 501 (see FIG. 5) or a weighted readout 601, which includes readings of the third unit structure 430 (see FIG. 6). A system tool 460 can be provided as part of the cascading decision tree structure 401 to read the currents across each of the first, second and third unit structures 410, 420 and 430 in a single operation.

It is to be understood that, while the description provided herein refers to the unit structures (i.e., the unit structure 101 of FIG. 1) having an n-type FeFET and a p-type FeFET, other types of unit structures can be provided with no undue experimentation based on the disclosures provided herein. These would include, but are not limited to, unit structures with dual n-type FeFETs or unit structures with dual p-type FeFETs. In these or other cases, the dual n-type FeFETs and the dual p-type FeFETs can be initially set to on or off conditions and can be turned on or off together. It is to be further understood that a unit structure (i.e., the unit structure 101 of FIG. 1) can include any number of FeFETs with no undue experimentation based on the disclosures provided herein. For example, a unit structure can have any number of FeFETs that is sufficient to define a digital sequence of 1s and 0s of a desired length (e.g., "10", "01", "11", "00", "11001100", etc.). Additionally, in a cascading decision tree structure (i.e., the cascading decision tree structure 401 of FIG. 4), additional volatile or non-volatile switching elements can be disposed between serial unit structures to engage or disengage differing pathways.

With reference to FIGS. 7 and 8, methods 700 and 800 of operating non-volatile memory is provided.

As shown in FIG. 7, the method 700 includes arranging unit structures in a cascading decision tree structure at block 701, where each of the unit structures includes n-type and p-type ferroelectric field effect transistors (FeFET). The method 700 can also include applying coercive voltages to selective ones of the unit structures to affect respective polarities of ferroelectric layers of the n-type and p-type FeFETs thereof at block 702. Subsequently, the method can include measuring currents across the n-type and p-type FeFETs of the selective ones of the unit structures at block 703 and confirming that the currents are in accordance with the coercive voltages applied to the selective ones of the unit structures at block 704.

As shown in FIG. 8, the method 800 includes shutting off and turning on power to the unit structures at block 801, re-measuring the currents across the n-type and p-type FeFETs of the selective ones of the unit structures at block 802 and confirming that stored information in the unit structures is preserved even if power is turned off (i.e., confirming a non-volatility of the unit structures) at block 803.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A unit structure arrangement of non-volatile memory, the unit structure arrangement comprising:
    a substrate;
    an n-type ferroelectric field effect transistor (FeFET) and a p-type FeFET disposed on the substrate;
    first circuitry by which sources of the n-type FeFET and the p-type FeFET are electrically coupled in parallel downstream from a common terminal;
    second circuitry by which top electrodes of the n-type FeFET and the p-type FeFET are electrically coupled in parallel upstream of a common terminal;
    first additional circuitry to electrically couple a drain of the n-type FeFET of a first unit structure exclusively to the first circuitry and in turn to each of the sources of the n-type and p-type FeFETs of one of two unit structures disposed in parallel downstream from the first unit structure; and
    second additional circuitry to electrically couple the drain of the p-type FeFET of the first unit structure exclusively to the second circuitry and in turn to each of the sources of the n-type and p-type FeFETs of the other one of the two unit structures disposed in parallel downstream from the first unit structure.

2. The unit structure arrangement according to claim 1, wherein the substrate comprises semiconductor material.

3. The unit structure arrangement according to claim 1, wherein ferroelectric layers of the n-type FeFET and the p-type FeFET comprise at least one of a hafnium oxide (HfO2)-based ferroelectric oxide, a zirconium oxide (ZrO2)-based ferroelectric oxide, a lead zirconate titanate (PZT)-based ferroelectric oxide and a strontium bismuth tantalate (SBT)-based ferroelectric oxide.

4. The unit structure arrangement according to claim 1, wherein top electrodes of the n-type FeFET and the p-type FeFET comprise at least one of titanium nitride (TiN), tungsten (W), platinum (Pt), platinum oxide (PtO), iridium (Ir), Iridium oxide (IrO), titanium aluminide (TiAl), tantalum aluminide (TaAl), titanium carbide (TiC), tantalum carbide (TaC), titanium aluminum carbide (TiAlC), tantalum aluminum carbide (TaAlC) and aluminum carbide (AlC).

5. The unit structure arrangement according to claim 1, wherein ferroelectric layers of the n-type FeFET and the p-type FeFET have same polarities.

6. A cascading decision tree structure of non-volatile memory, comprising:
    a first unit structure;
    second and third unit structures disposed in parallel downstream from the first unit structure,
    each of the first, second and third unit structures comprising:
        n-type and p-type ferroelectric field effect transistors (FeFET);
        first circuitry by which sources of the n-type and p-type FeFETs are electrically coupled; and
        second circuitry by which top electrodes of the n-type and p-type FeFETs are electrically coupled,
    the cascading decision tree structure further comprising additional circuitry by which drains of the n-type and p-type FeFETs of the first unit structure are electrically coupled to sources of the n-type and p-type FeFETs of the second and third unit structures,
    wherein the additional circuitry comprises:
        first additional circuitry to electrically couple the drain of the n-type FeFET of the first unit structure exclusively to the first circuitry and in turn to each of the sources of the n-type and p-type FeFETs of the second unit structure; and
        second additional circuitry to electrically couple the drain of the p-type FeFET of the first unit structure exclusively to the first circuitry and in turn to each of the sources of the n-type and p-type FeFETs of the third unit structure.

7. The cascading decision tree structure according to claim 6, wherein the n-type and p-type FeFETs of each of the first, second and third unit structures comprise a semiconductor substrate material.

8. The cascading decision tree structure according to claim 6, wherein:
    ferroelectric layers of the n-type and p-type FeFETs of each of the first, second and third unit structures comprise at least one of a hafnium oxide (HfO2)-based ferroelectric oxide, a zirconium oxide (ZrO2)-based ferroelectric oxide, a lead zirconate titanate (PZT)-based ferroelectric oxide and a strontium bismuth tantalate (SBT)-based ferroelectric oxide, and
    the top electrodes of the n-type and p-type FeFETs of each of the first, second and third unit structures comprise at least one of titanium nitride (TiN), tungsten (W), platinum (Pt), platinum oxide (PtO), iridium (Ir), Iridium oxide (IrO), titanium aluminide (TiAl), tantalum aluminide (TaAl), titanium carbide (TiC), tantalum carbide (TaC), titanium aluminum carbide (TiAlC), tantalum aluminum carbide (TaAlC) and aluminum carbide (AlC).

9. The cascading decision tree structure according to claim 6, wherein ferroelectric layers of the n-type FeFET and the p-type FeFET of each of the first, second and third unit structures have same polarities.

10. The cascading decision tree structure according to claim 6, further comprising:
    first additional unit structures disposed in parallel downstream from the second unit structure; and
    second additional unit structures disposed in parallel downstream from the third unit structure.

11. The cascading decision tree structure according to claim 6, further comprising a system tool to read voltages across each of the first, second and third unit structures in a single operation.

12. The cascading decision tree structure according to claim 6, wherein the currents across each of the first, second and third unit structures are weighted.

13. A method of operating non-volatile memory, the method comprising:
    arranging unit structures in a cascading decision tree structure by disposing second and third unit structures in parallel downstream from a first unit structure, each of the first, second and third unit structures comprising:
        n-type and p-type ferroelectric field effect transistors (FeFET);
        first circuitry by which sources of the n-type and p-type FeFETs are electrically coupled; and
        second circuitry by which top electrodes of the n-type and p-type FeFETs are electrically coupled,
    wherein the arranging comprises:
        electrically coupling a drain of the n-type FeFET of the first unit structure exclusively to the first circuitry and in turn to each of the sources of the n-type and p-type FeFETs of the second unit structure; and electrically coupling a drain of the p-type FeFET of the first unit structure exclusively to the first circuitry and in turn to each of the sources of the n-type and p-type FeFETs of the third unit structure, wherein the method further comprises:

applying coercive voltages to selective ones of the first, second and third unit structures to affect respective polarities of ferroelectric layers of the n-type and p-type FeFETs thereof;

measuring currents across the n-type and p-type FeFETs of the selective ones of the first second and third unit structures; and confirming that the currents are in accordance with the coercive voltages applied to the selective ones of the first, second and third unit structures.

14. The method according to claim 13, further comprising:

shutting off and turning on power to the unit structures;

re-measuring the voltage drops across the n-type and p-type FeFETs of the selective ones of the unit structures; and confirming that stored information in the unit structures is preserved even if power is turned off.

15. The method according to claim 14, wherein the measuring and the re-measuring each comprise weighing the currents.

* * * * *